(12) United States Patent
Makiuchi

(10) Patent No.: US 10,635,126 B2
(45) Date of Patent: Apr. 28, 2020

(54) CONSTANT CURRENT CIRCUIT, SEMICONDUCTOR DEVICE, ELECTRONIC APPARATUS, AND METHOD OF MANUFACTURING SEMICONDUCTOR DEVICE

(71) Applicant: SEIKO EPSON CORPORATION, Tokyo (JP)

(72) Inventor: Yoshiki Makiuchi, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/365,767

(22) Filed: Mar. 27, 2019

(65) Prior Publication Data

US 2019/0302823 A1 Oct. 3, 2019

(30) Foreign Application Priority Data

Mar. 28, 2018 (JP) ................................. 2018-061452

(51) Int. Cl.
*G05F 3/24* (2006.01)
*H01L 21/822* (2006.01)
*H01L 27/04* (2006.01)

(52) U.S. Cl.
CPC .............. *G05F 3/24* (2013.01); *H01L 21/822* (2013.01); *H01L 27/04* (2013.01)

(58) Field of Classification Search
CPC .......... G05F 3/24; H01L 21/822; H01L 27/04
USPC ....... 327/103, 530, 538, 542, 543, 564, 565, 327/566, 574, 576, 581
See application file for complete search history.

(56) References Cited

U.S. PATENT DOCUMENTS

| | | | | |
|---|---|---|---|---|
| 5,311,115 A | * | 5/1994 | Archer | H01L 27/0883 323/315 |
| 6,005,378 A | * | 12/1999 | D'Angelo | G05F 3/242 323/273 |
| 9,450,568 B1 | * | 9/2016 | Hawkins | H03K 17/162 |
| 2008/0100389 A1 | * | 5/2008 | Wu | H03K 3/011 331/111 |
| 2018/0348807 A1 | * | 12/2018 | Sugiura | G05F 3/262 |

FOREIGN PATENT DOCUMENTS

| JP | H02-053309 A | 2/1990 |
|---|---|---|
| JP | 2001-320025 A | 11/2001 |

* cited by examiner

*Primary Examiner* — William Hernandez
(74) *Attorney, Agent, or Firm* — Oliff PLC

(57) ABSTRACT

In an N-channel depletion type first transistor, a gate is connected to a reference node and a drain is connected to a current output node. In a P-channel enhancement type second transistor, a gate and a drain are connected to the reference node and a source is connected to a source of the N-channel depletion type first transistor.

8 Claims, 2 Drawing Sheets

CONSTANT CURRENT CIRCUIT, SEMICONDUCTOR DEVICE, ELECTRONIC APPARATUS, AND METHOD OF MANUFACTURING SEMICONDUCTOR DEVICE

BACKGROUND

1. Technical Field

The present invention relates to a constant current circuit suitable as a constant current source in a semiconductor device.

2. Related Art

JP-A-2-53309 discloses a constant current circuit configured with a depletion type metal oxide semiconductor (MOS) transistor having a short circuit between a gate and a source (hereinafter MOS transistor simply referred to as a transistor). This constant current circuit is commonly used because of its simple configuration.

However, in order to obtain a minute current in the above-described constant current circuit, it is necessary to lengthen a channel length of the depletion type transistor, and there is a problem that a layout area of the constant current circuit in the semiconductor device becomes large.

SUMMARY

A constant current circuit according to an aspect of the invention includes: a depletion type first transistor in which a first conductivity type is included, a gate is connected to a reference node, and a drain is connected to a current output node; and an enhancement type second transistor in which a second conductivity type reverse to the first conductivity type is included, a gate and a drain are connected to the reference node, and a source is connected to a source of the first transistor.

In a preferable aspect, the first conductivity type is N-channel and the second conductivity type is P-channel. In another preferable aspect, the first conductivity type is P-channel and the second conductivity type is N-channel.

According to the constant current circuit according to the aspect of the invention, a voltage corresponding to a threshold voltage of a second transistor is generated between a drain and a source of the second transistor, the voltage is applied between a gate and a source of a first transistor, and a drain current of the first transistor is decreased. Therefore, a channel length of the first transistor necessary for generating a minute constant current in the constant current circuit can be shortened. Also, in the constant current circuit, conductivity types of the first transistor and the second transistor are reverse. Therefore, it is possible to form a channel dope layer for threshold control of the first transistor and a channel dope layer for threshold control of the second transistor in a common production process using a common mask in a manufacturing process of the constant current circuit. In this way, it is possible to reduce variations in an output current of the constant current circuit due to manufacturing variations by interlocking a fluctuation of a threshold voltage of the first transistor and a fluctuation of a threshold voltage of the second transistor caused by the manufacturing variation.

The invention can also be implemented as a semiconductor device including the above-described constant current circuit or an electronic apparatus including the semiconductor device.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments will be described with reference to the drawings.

First Embodiment

Figure 1:
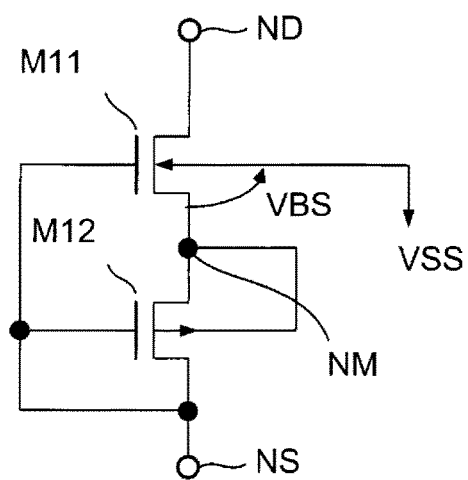
FIG. 1 is a circuit diagram showing a configuration of a constant current circuit according to a first embodiment.

FIG. 1 is a circuit diagram showing a configuration of a constant current circuit according to a first embodiment. In the present embodiment, a first conductivity type is N-channel, and a second conductivity type is P-channel.

In FIG. 1, a first transistor M11 is a depletion type transistor in which the conductivity type is the N-channel. In the first transistor M11, a gate is connected to a reference node NS and a drain is connected to a current output node ND. A P well in which the drain and a source of the transistor M11 are formed is connected to a low potential power supply VSS. The reference node NS is connected to a constant voltage source such as a low potential power supply VSS, for example.

A second transistor M12 is an enhancement type transistor in which the conductivity type is the P-channel. In the second transistor M12, a gate and a drain are connected to the reference node NS and a source is connected to the source of the transistor M11. Further, an N well in which the drain and the source of the second transistor M12 are formed is connected to the source of the first transistor M11. In the following description, a node to which the source of the first transistor M11, the source of the second transistor M12, and the N well are commonly connected, is defined as a node NM.

The above is the configuration of the constant current circuit according to the present embodiment. According to the present embodiment, when outputting the current of the constant current circuit, a constant voltage corresponding to a threshold voltage of the second transistor M12 is generated between the node NM to which the source of the first transistor M11 is connected and the reference node NS to which the gate of the first transistor M11 is connected. Therefore, a bias between the gate and the source contributing to the formation of the channel of the first transistor M11 is reduced by the constant voltage, and the drain current of the first transistor M11 is reduced. Therefore, a channel length of the first transistor M11 required to obtain a minute current can be shortened.

Figure 5:
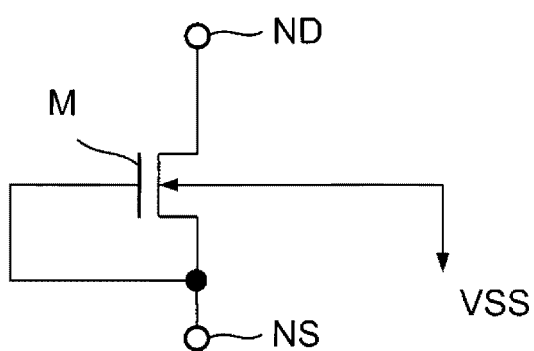
FIG. 5 is a circuit diagram showing a configuration of a constant current circuit as a comparative example.

Hereinafter, a comparative example will be described and the effects of the embodiment will be described. FIG. 5 is a circuit diagram showing a configuration of a constant current circuit as a comparative example. In this constant current circuit, as for a depletion type transistor M in which the conductivity type is the N-channel, a gate and a source are connected to a reference node NS and a drain is connected to a current output node ND. A P well in which the drain and the source of the transistor M are formed is connected to a low potential power supply VSS. The reference node NS is connected to a constant voltage source such as a low potential power supply VSS, for example.

In the constant current circuit, since a voltage VGS between the gate and the source of the transistor M is 0V, when a positive voltage is applied between the current output node ND and the reference node NS, a saturation current I shown in the following expression flows into the transistor M.

$$I=(\tfrac{1}{2})\times\mu n\times C_{ox}\times(W/L)\times V_{thn}^{2} \tag{1}$$

Here, μn is a carrier mobility between the drain and the source of the transistor M, $C_{ox}$ is a gate oxide film capacitance per unit area, W is a width of the channel, L is a length of the channel, and $V_{thn}$ is a threshold voltage.

In order to reduce the current I flowing into the current output node ND in this constant current circuit, the following methods are considered, (1) decrease $\mu n \times C_{ox}$, (2) decrease W and increase L, and (3) decrease |Vth|. Among above-described variables, $\mu n \times C_{ox}$ and $V_{thn}$ are constants determined by the manufacturing process and cannot easily be changed. In addition, although W and L are design items that can be changed, W cannot be set smaller than the minimum size depending on the manufacturing process. Therefore, the current I is decreased by increasing L. However, in a watch IC or the like, a constant current circuit that generates a minute current of, for example, about 10 nA is required.

As an example, $\mu n \times C_{ox}$=320 μA/V² and $V_{thn}$=−0.65 V which are determined by a manufacturing process, W=0.6 μm which is the minimum size determined by a processing rule, and the current I=10 nA are substituted into the expression (1) then L is solved as follows.

$$L=4056\ \mu m \tag{2}$$

Generally, as the manufacturing process becomes finer, $\mu n^{*}C_{ox}$ becomes larger, so L becomes longer to obtain a minute constant current. As described above, the constant current circuit in the related art has a problem that L becomes very long when generating a minute constant current, and the area becomes large.

In the constant current circuit according to the present embodiment, the second transistor M12 is turned ON when an absolute value of a voltage (negative voltage) between the reference node NS and the node NM becomes greater than or equal to an absolute value of a threshold voltage $V_{thp}$ (negative voltage) of the second transistor M12. Therefore, the second transistor M12 functions as a constant voltage source that outputs the constant voltage $|V_{hp}|$. Also, a voltage between the gate and the source becomes 0V−$|V_{thp}|$ since the potential of the source rises from the potential of the reference node NS by the voltage $|V_{thp}|$. Therefore, assuming that μn is a carrier mobility between the drain and the source of the first transistor M11, $C_{ox}$ is a gate oxide film capacitance per unit area, W1 is a width of the channel, L1 is a length of the channel, $V_{thn}$ is a threshold voltage, and VGS1 is a voltage between the gate and the source, a drain current I1 flowing through the first transistor M11 is expressed by the following expression.

$$I1=(\tfrac{1}{2})\times\mu n\times C_{ox}\times(W1/L1)\times(VGS1-V_{thn})^{2}=(\tfrac{1}{2})\times\mu n\times C_{ox}\times(W1/L1)\times(0V-|V_{thp}|-V_{thn})^{2} \tag{3}$$

$V_{thn}$ is a negative value since the first transistor M11 is the depletion type. Therefore, the above expression (4) can be modified as follows.

$$I1=(\tfrac{1}{2})\times\mu n\times C_{ox}\times(W1/L1)\times(|V_{thp}|-|V_{thp}|)^{2} \tag{4}$$

If the expression (4) is compared with the above expression (1), $\mu n \times C_{ox}$ and $V_{thn}$ are the same, and it can be found that if W/L=W1/L1 the I1<I. W/L<W1/L1 may be used to obtain the same current value in the equations (1) and (4).

As an example, $\mu n \times C_{ox}$=320 μA/V², $V_{thn}$=−0.65 V, and $V_{thp}$=−0.6 V which are determined by a manufacturing process, W1=0.61 μm which is the minimum size determined by a processing rule, and the current I1=10 nA are substituted into the expression (4) then L1 is solved as follows.

$$L1=24\ [\mu m] \tag{5}$$

In the constant current circuit shown in FIG. 1, a P-channel enhancement type second transistor M12 is required, and the second transistor M12 may have a channel width of about 0.61 μm and a channel length of about 10 μm. The constant current circuit shown in FIG. 1 can reduce the overall layout area since the length of the channel L1 of the N-channel depression type first transistor M11 can be shortened. Although not shown in the expression (4), in the N-channel first transistor M11, since a potential difference VBS=$|V_{thp}|$ occurs between the source and the P well, the threshold voltage $V_{thn}$ shifts in a plus direction by a substrate bias effect and $|V_{thn}|$ becomes small, and there is also an effect that the current I1 reduced.

Figure 2:
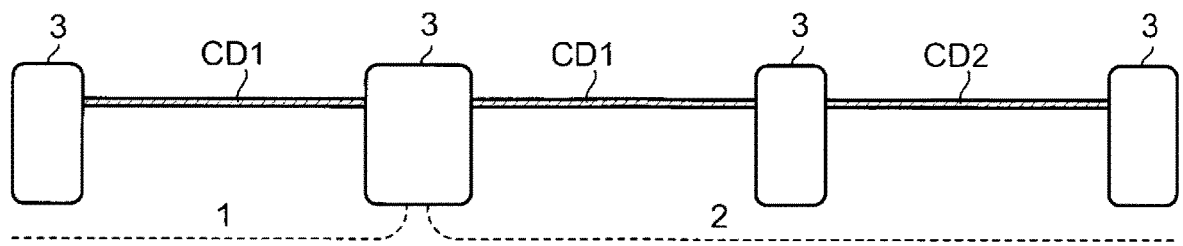
FIG. 2 is a cross sectional diagram showing a configuration of a semiconductor substrate in a manufacturing process of a semiconductor device including the same constant current circuit.
Figure 3:
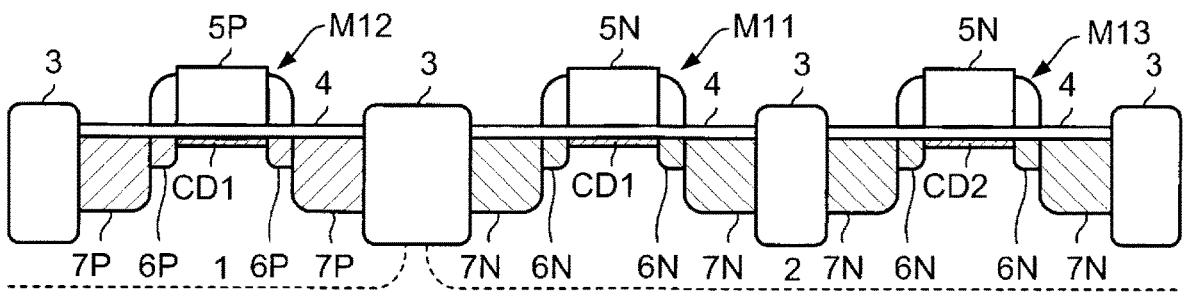
FIG. 3 is a cross sectional diagram showing a configuration of the semiconductor substrate in the manufacturing process of the semiconductor device including the same constant current circuit.

The present embodiment also has another effect. In order to reduce the manufacturing production process, depending on the manufacturing process, there are cases that a common mask is used for the P-channel enhancement type transistor and the N-channel depletion type transistor, and a channel drop is performed for controlling the threshold voltage in a common production process. FIG. 2 and FIG. 3 are cross sectional diagrams showing a configuration of a semiconductor substrate in a manufacturing production process of such a manufacturing process.

In FIG. 2, an N well 1 which is configured to a low concentration N-type impurity layer for forming a P-channel transistor and a P well 2 which is configured to a low concentration P-type impurity layer for forming an N-channel transistor are formed on a semiconductor substrate. Also, in FIG. 2, an element isolation layer 3 for insulating between the transistors is formed on the semiconductor substrate.

In FIG. 2, a channel doped layer CD1 is formed in a region forming the N-channel depletion type transistor in the N well 1 and the P well 2. The channel doped layer CD1 is a channel doped layer for shifting a threshold voltage of the P-channel transistor formed in the N well 1 and the N-channel depletion type transistor formed in the P well 2 in a minus direction.

In FIG. 2, a channel doped layer CD2 for controlling a threshold voltage of the N-channel enhancement type transistor is formed in a region forming the same transistor in the P well 2.

FIG. 3 shows a configuration of the semiconductor substrate after the P-channel transistor and the N-channel transistor are formed. In FIG. 3, the P-channel enhancement type second transistor M12 and the N-channel depletion type first transistor M11 shown in FIG. 1, are shown, and an N-channel enhancement type transistor M13 not shown in FIG. 1, is shown.

In FIG. 3, gate oxide films 4 are formed on the surfaces of the N well 1 and the P well 2 partitioned by element isolation layers 3, and a gate 5P of the P-channel transistor and a gate 5N of the N-channel transistor are formed thereon.

The source and the drain of the P-channel second transistor M12 are formed on both sides of region right under the gate 5P in the N well 1. The source and the drain of the P-channel second transistor M12 are configured with a high concentration deep P-type impurity layer 7P and a low concentration shallow P-type impurity layer 6P, respectively. The P-type impurity layer 6P occupies a position closer to the gate 5P than the P-type impurity layer 7P. In the N well 1, a region sandwiched between the P-type impurity layer 6P at the source and the P-type impurity layer 6P at the drain of the P-channel second transistor M12, is a channel formation region of the P-channel second transistor M12. The channel doped layer CD1 is formed in the channel formation region of the P-channel second transistor M12.

The source and the drain of the N-channel first transistor M11 or the N-channel transistor M13 are formed on both sides of region right under the gate 5N in the P well 2. The source and the drain of the N-channel first transistor M11 or the N-channel transistor M13 are configured with a high concentration deep N-type impurity layer 7N and a low concentration shallow N-type impurity layer 6N, respectively. The N-type impurity layer 6N occupies a position closer to the gate 5N than the N-type impurity layer 7N. In the P well 2, a region sandwiched between the N-type impurity layer 6N at the source and the N-type impurity layer 6N at the drain of the N-channel first transistor M11 or the N-channel transistor M13, is a channel formation region of the N-channel first transistor M11 or the N-channel transistor M13. A channel doped layer CD1 is formed in the channel forming region of the N-channel depletion type first transistor M11 and a channel doped layer CD2 is formed in the channel formation region of the N-channel enhancement type transistor M13.

In the P-channel enhancement type second transistor M12 and the N-channel depletion type first transistor M11 in this configuration, since the common channel doped layer CD1 is formed in each channel formation region, the respective threshold voltages are interlocked. That is, by manufacturing variations, when the threshold voltage of one side transistor fluctuates in a plus direction, the threshold voltage of the other side transistor also fluctuates in the plus direction, and when the threshold voltage of one side transistor fluctuates in a minus direction, the other side transistor also fluctuates in the minus direction. Therefore, it is possible to reduce the variations in $|V_{thn}|-|V_{thp}|$ of Expression (4) caused by the manufacturing variations and to reduce variations in the constant current value.

Second Embodiment

Figure 4:
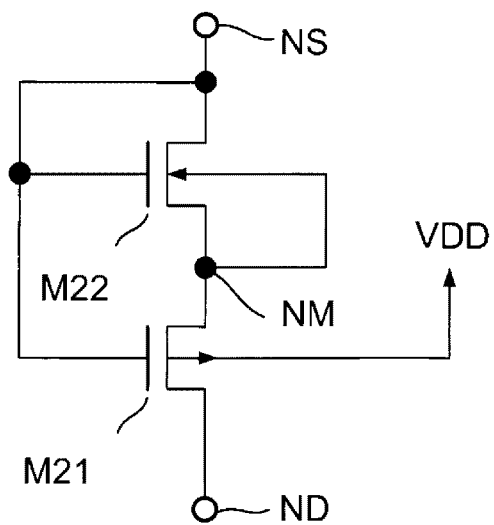
FIG. 4 is a circuit diagram showing a configuration of a constant current circuit according to a second embodiment.

FIG. 4 is a circuit diagram showing a configuration of a constant current circuit according to a second embodiment. In the present embodiment, a first conductivity type is P-channel, and a second conductivity type is N-channel. In FIG. 4, a first transistor M21 is a depletion type transistor in which the conductivity type is the P-channel. In the first transistor M21, a gate is connected to a reference node NS and a drain is connected to a current output node ND. An N well in which the drain and a source of the first transistor M21 are formed is connected to a high potential power supply VDD. The reference node NS is connected to a constant voltage source such as a high potential power supply VDD, for example.

A second transistor M22 is an enhancement type transistor in which the conductivity type is the N-channel. In the second transistor M22, a gate and a drain are connected to the reference node NS and a source is connected to the source of the transistor M21. Further, a P well in which the drain and the source of the second transistor M22 are connected to the source of the transistor M21. In the following description, a node to which the source of the first transistor M21, the source of the second transistor M22, and the P well are commonly connected, is defined as a node NM.

In the constant current circuit, the second transistor M22 is turned ON when a voltage (positive voltage) between the reference node NS and the node NM becomes greater than or equal to a threshold voltage $V_{thn}$ (positive voltage) of the second transistor M22. Therefore, the second transistor M22 functions as a constant voltage source that outputs the threshold voltage $V_{thn}$ and decreasing the drain current of the first transistor M21 by lowering a source potential of the first transistor M21 from the potential of the reference node NS by the threshold voltage $V_{thn}$. Therefore, the same effect as in the above-described first embodiment can be also obtained in the present embodiment. It is also possible to form the channel dope layer of the first transistor M21 and the channel dope layer of the second transistor M22 in a common production process using a common mask in the present embodiment. Therefore, it is also possible to reduce variations in an output current of the constant current circuit due to the manufacturing variations in the present embodiment.

Other Embodiment

The first and second embodiments have been described above, and other embodiments are also conceivable. For example, it is as follows.

(1) In the first embodiment, the N well of the second transistor M12 is connected to the common connection point between the sources of the first transistor M11 and the second transistor M12, but the N well of the second transistor M12 may be connected to other nodes, for example, a high potential power supply VDD.

(2) In the second embodiment, the P well of the second transistor M22 is connected to the common connection point between the sources of the first transistor M21 and the second transistor M22, but the P well of the second transistor M22 may be connected to other nodes, for example, a low potential power supply VSS.

(3) The above-described constant current circuit can be applied to a semiconductor device including the constant current circuit and an electronic apparatus including the same semiconductor device.

The entire disclosure of Japanese Patent Application No. 2018-061452, filed Mar. 28, 2018 is expressly incorporated by reference herein.

What is claimed is:

1. A constant current circuit comprising:
   a depletion type first transistor in which a first conductivity type is included, a gate is connected to a reference node, and a drain is connected to a current output node; and
   an enhancement type second transistor in which a second conductivity type reverse to the first conductivity type is included, a gate and a drain are connected to the reference node, and a source is connected to a source of the first transistor.

2. The constant current circuit according to claim 1, wherein the first conductivity type is N-channel and the second conductivity type is P-channel.

3. A semiconductor device comprising the constant current circuit according to claim 2.

4. The constant current circuit according to claim 1, wherein the first conductivity type is P-channel and the second conductivity type is N-channel.

5. A semiconductor device comprising the constant current circuit according to claim 4.

6. A semiconductor device comprising the constant current circuit according to claim 1.

7. An electronic apparatus comprising the semiconductor device according to claim 6.

8. A method of manufacturing a semiconductor device including a constant current circuit that includes a depletion type first transistor in which a first conductivity type is included, a gate is connected to a reference node, and a drain is connected to a current output node, and an enhancement type second transistor in which a second conductivity type reverse to the first conductivity type is included, a gate and a drain are connected to the reference node, and a source is connected to a source of the first transistor, the method comprising:
   forming a channel dope layer of the first transistor and a channel dope layer of the second transistor in a common production process using a common mask.

* * * * *